(12) United States Patent
Choi et al.

(10) Patent No.: US 8,043,952 B2
(45) Date of Patent: Oct. 25, 2011

(54) METHOD OF FORMING ALUMINUM OXIDE LAYER AND METHOD OF MANUFACTURING CHARGE TRAP MEMORY DEVICE USING THE SAME

(75) Inventors: Sang-moo Choi, Yongin-si (KR); Kwang-soo Seol, Suwon-si-si (KR); Woong-chul Shin, Daejeon (KR); Sang-jin Park, Pyeongtaek-si-si (KR); Eun-ha Lee, Seoul (KR); Jung-hun Sung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 560 days.

(21) Appl. No.: 12/153,655

(22) Filed: May 22, 2008

(65) Prior Publication Data

US 2009/0061613 A1 Mar. 5, 2009

(30) Foreign Application Priority Data

Aug. 29, 2007 (KR) ........................ 10-2007-0087290

(51) Int. Cl.
*H01L 21/3205* (2006.01)
*H01L 21/4763* (2006.01)
*H01L 21/8242* (2006.01)
*H01L 29/788* (2006.01)

(52) U.S. Cl. ................ 438/594; 438/250; 257/E21.476; 257/E21.294; 257/316

(58) Field of Classification Search .................. None
See application file for complete search history.

(56) References Cited

U.S. PATENT DOCUMENTS

| 6,355,519 | B1 * | 3/2002 | Lee ............................... 438/250 |
| 2004/0051134 | A1 * | 3/2004 | Jang et al. .................... 257/316 |
| 2008/0001249 | A1 * | 1/2008 | Sheen et al. .................. 257/499 |
| 2008/0079064 | A1 * | 4/2008 | Lai et al. ...................... 257/326 |

* cited by examiner

*Primary Examiner* — Ha Tran T Nguyen
*Assistant Examiner* — Valerie N Brown
(74) *Attorney, Agent, or Firm* — Harness, Dickey & Pierce, P.L.C.

(57) ABSTRACT

Provided is a method of forming an aluminum oxide layer and a method of manufacturing a charge trap memory device using the same. The method of forming an aluminum oxide layer may include forming an amorphous aluminum oxide layer on an underlying layer, forming a crystalline auxiliary layer on the amorphous aluminum oxide layer, and crystallizing the amorphous aluminum oxide layer. Forming the crystalline auxiliary layer may include forming an amorphous auxiliary layer on the amorphous aluminum oxide layer; and crystallizing the amorphous auxiliary layer.

19 Claims, 8 Drawing Sheets
(1 of 8 Drawing Sheet(s) Filed in Color)

US 8,043,952 B2

METHOD OF FORMING ALUMINUM OXIDE LAYER AND METHOD OF MANUFACTURING CHARGE TRAP MEMORY DEVICE USING THE SAME

PRIORITY STATEMENT

This application claims priority under 35 U.S.C. §119 to Korean Patent Application No. 10-2007-0087290, filed on Aug. 29, 2007, in the Korean Intellectual Property Office (KIPO), the entire contents of which are incorporated herein by reference for all purposes as if fully set forth herein.

BACKGROUND

1. Field

Example embodiments relate to a method of manufacturing a semiconductor device, and more particularly, to a method of forming an aluminum oxide layer and a method of manufacturing a charge trap memory device using the same.

2. Description of the Related Art

Because the amount of data to be securely stored for a relatively long time may be increased and a data storage device, e.g., a memory stick, for moving a task result to another place may be provided, there is a need for a non-volatile memory device wherein data may be electrically stored and erased and which may conserve stored data even when power is not supplied.

Conventionally, increased capacity non-volatile memory devices, e.g., NAND flash memory devices, may be used. The NAND flash memory device may have a structure in which a floating gate for storing charges (e.g., data) and a control gate for controlling the storing of charges in the floating gate may be sequentially laminated. However, the floating gate may include a conductive material, e.g., doped polysilicon, which may cause increased parasitic capacitance between adjacent memory cells when higher integration is desired.

Accordingly, in order to solve the aforementioned problem of the conventional NAND flash memory device, there has been research on non-volatile memory devices referred to as Metal-Oxide-Insulator-Oxide-Semiconductor (MOIOS) memory devices, e.g., Silicon-Oxide-Nitride-Oxide-Semiconductor (SONOS) memory devices or Metal-Oxide-Nitride-Oxide-Semiconductor (MONOS) memory devices. The SONOS memory device may use silicon as a material for the control gate, but the MONOS memory device may use a metal as the material for the control gate.

The MOIOS memory device may include a charge trap layer, e.g., a silicon nitride ($Si_3N_4$) film, instead of a floating gate, which includes polysilicon, in order to store charges. For example, a structure of a memory cell in the MOIOS memory device may include an oxide film, a nitride film, and an oxide film, which may be sequentially laminated between a substrate and the control gate. The MOIOS memory device may use a characteristic, whereby a threshold voltage may be shifted as charges may be trapped in the nitride film.

A dielectric constant of the silicon nitride film and a silicon-oxide film in the conventional MOIOS memory device, e.g., the SONOS memory device, may be relatively low. Thus, the conventional MOIOS memory device may have an increased operation voltage, decreased speed for recording (programming) and erasing data, and relatively short retention time (a time during which stored data may be conserved). One method to increase the retention time may be to use an aluminum oxide ($Al_2O_3$) layer, which has an alpha-phase crystalline structure, as a blocking layer.

The aluminum oxide ($Al_2O_3$) layer having the alpha-phase crystalline structure may be formed by thermal treating an amorphous aluminum oxide ($Al_2O_3$) layer at a temperature higher than about 1200° C. However, a silicon substrate may bend due to thermal stress from the thermal treatment process. Hence, the aluminum oxide ($Al_2O_3$) layer having the alpha-phase crystalline structure may be difficult to use as the blocking layer.

SUMMARY

Example embodiments provide a method of forming an aluminum oxide layer without damaging a substrate. Example embodiments also provide a method of manufacturing a charge trap memory device by using the method of forming an aluminum oxide layer, thereby enhancing a charge retention capability of the charge trap memory device.

According to example embodiments, a method of forming an alpha aluminum oxide layer may include forming an amorphous aluminum oxide layer on an underlying layer, forming a crystalline auxiliary layer on the amorphous aluminum oxide layer, and crystallizing the amorphous aluminum oxide layer.

The method may further include removing the crystalline auxiliary layer. The underlying layer may be formed of a charge storage material. The charge storage material may be a silicon nitride. A densification process for the amorphous aluminum oxide layer may be performed before the crystalline auxiliary layer may be formed. Forming the crystalline auxiliary layer may include forming an amorphous auxiliary layer on the amorphous aluminum oxide layer, and crystallizing the amorphous auxiliary layer. The densification process for the amorphous aluminum oxide layer may be performed before the amorphous auxiliary layer may be formed. The crystallization of the amorphous auxiliary layer and the crystallization of the amorphous aluminum oxide layer may be simultaneously performed at a temperature below about 1000° C.

The crystalline auxiliary layer may be one of a $Cr_2O_3$ layer having an alpha-phase crystalline structure, an alpha-$FeO_3$ layer, a $Ga_2O_3$ layer, an $Rh_2O_3$ layer, a $Ti_2O_3$ layer, a $V_2O_3$ layer, a gamma-$Al_2S_3$ layer, and a $Co_2As_3$ layer. The crystallization of the amorphous auxiliary layer may be performed at a temperature lower than the temperature for the crystallization of the amorphous aluminum oxide layer. The crystallization of the amorphous auxiliary layer may be performed at a temperature below about 800° C. In removing the crystalline auxiliary layer, the crystalline auxiliary layer may be partially removed.

According to example embodiments, a method of manufacturing a charge trap memory device may include forming a tunneling film, a charge storage layer, a blocking insulation layer, and a gate electrode on a substrate, wherein forming the blocking insulation layer includes forming the alpha aluminum oxide layer according to example embodiments, in which the charge storage layer may be the underlying layer.

Forming the charge storage layer may include forming one of a silicon nitride film, a metal nano dot, and a silicon nano dot. The charge storage layer may be formed to have a multilayer structure or a mixed structure which includes at least two of the silicon nitride film, the metal nano dot, and the silicon nano dot. Also, the charge storage layer may be one of a doped polysilicon film, a silicon nitride film, an $HfO_2$ film, a $La_2O_3$ film, and a $ZrO_2$ film or the charge storage layer may be one of mixtures including at least two of the doped polysilicon film, the silicon nitride film, the $HfO_2$ film, the $La_2O_3$ film, and the $ZrO_2$ film. A work function of the gate electrode may be over about 4.0 eV. Forming the gate electrode may include forming a TaN (tantalum nitride) electrode.

BRIEF DESCRIPTION OF THE DRAWINGS

The patent or application file contains at least one drawing executed in color. Copies of this patent or patent application publication with color drawing will be provided by the Office upon request and payment of the necessary fee.

Example embodiments will be more clearly understood from the following detailed description taken in conjunction with the accompanying drawings.

FIGS. 1-3 are diagrams illustrating a method of forming an alpha aluminum oxide layer according to example embodiments;

FIGS. 4-7 are diagrams illustrating a method of manufacturing a charge trap memory device according to example embodiments;

FIG. 8 shows graph results of an X-ray diffraction analysis experiment conducted so as to confirm a crystalline structure of a crystalline chromium oxide layer formed by thermally treating an amorphous chromium oxide layer;

FIG. 9 shows graph results of a test conducted so as to confirm whether a crystalline structure of a crystalline aluminum oxide layer, formed by using a chromium oxide layer having an alpha-phase crystalline structure, is in an alpha-phase;

FIG. 10 illustrates Transmission Electron Microscope (TEM) pictures of a crystallized sample obtained by depositing an amorphous chromium oxide layer on an amorphous aluminum oxide layer and then performing a thermal treatment at a temperature of about 900° C.;

FIG. 11 shows experimental results to determine whether a chromium oxide layer having an alpha-phase crystalline structure has an effect on an aluminum oxide layer having a gamma-phase crystalline structure; and FIG. 12 shows experimental results to determine the effect of a densification process for an amorphous aluminum oxide layer in the method of forming the alpha aluminum oxide layer described in FIGS. 1-3.

Figure 1:
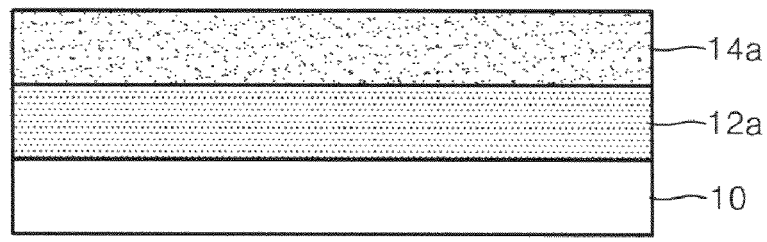
FIGS. 1-12 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a method of forming an aluminum oxide layer having an alpha-phase crystalline structure and a method of manufacturing a charge trap memory device using the same according to example embodiments will now be described more fully with reference to the accompanying drawings, in which exemplary embodiments may be shown. In the drawings, the thicknesses of layers and regions are exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In example embodiments, a method of forming an alpha-phase crystalline aluminum oxide ($\alpha$-$Al_2O_3$) layer, which has the largest energy band gap and the smallest defect density from among a plurality of aluminum oxides, may be used in a process for manufacturing a charge trap memory device, for example, in a process for forming a blocking oxide layer, thereby enhancing the charge retention capability of the charge trap memory device. The method of forming the alpha-phase crystalline aluminum oxide ($\alpha$-$Al_2O_3$) layer, for example, the aluminum oxide layer having the alpha-phase crystalline structure (hereinafter, referred to as 'an alpha aluminum oxide layer') according to example embodiments will be now described.

Referring to FIG. 1, an amorphous aluminum oxide layer 12a may be formed on an underlying layer 10. The amorphous aluminum oxide layer 12a may be an $Al_2O_3$ layer. The amorphous aluminum oxide layer 12a may be formed using various deposition methods, e.g., an atomic layer deposition (ALD) method, a sputtering vapor deposition method and/or a chemical vapor deposition (CVD) method. An amorphous chromium oxide layer 14a may be formed on the amorphous aluminum oxide layer 12a. The amorphous chromium oxide layer 14a may be a $Cr_2O_3$ layer. The amorphous chromium oxide layer 14a may be formed using the same methods as the methods for forming the amorphous aluminum oxide layer 12a.

Figure 2:
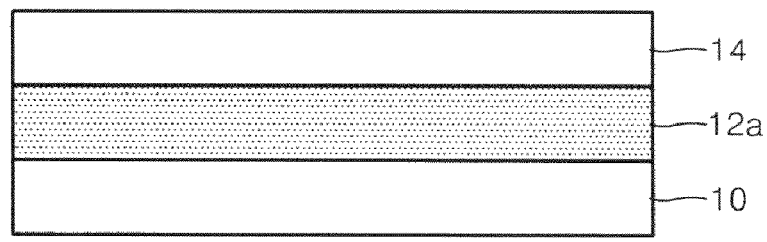

The amorphous chromium oxide layer 14a may be thermally treated (hereinafter, referred to as 'a first thermal treatment') so as to be crystallized. The first thermal treatment may be performed at a temperature that does not affect crystallization of the amorphous aluminum oxide layer 12a. For example, the first thermal treatment may be performed at a temperature of about 600° C. to about 900° C., for example, below about 700° C., so as not to affect the amorphous aluminum oxide layer 12a. Due to the first thermal treatment, the amorphous chromium oxide layer 14a may change into a chromium oxide layer 14 having an alpha-phase crystalline structure, as illustrated in FIG. 2.

Figure 8:
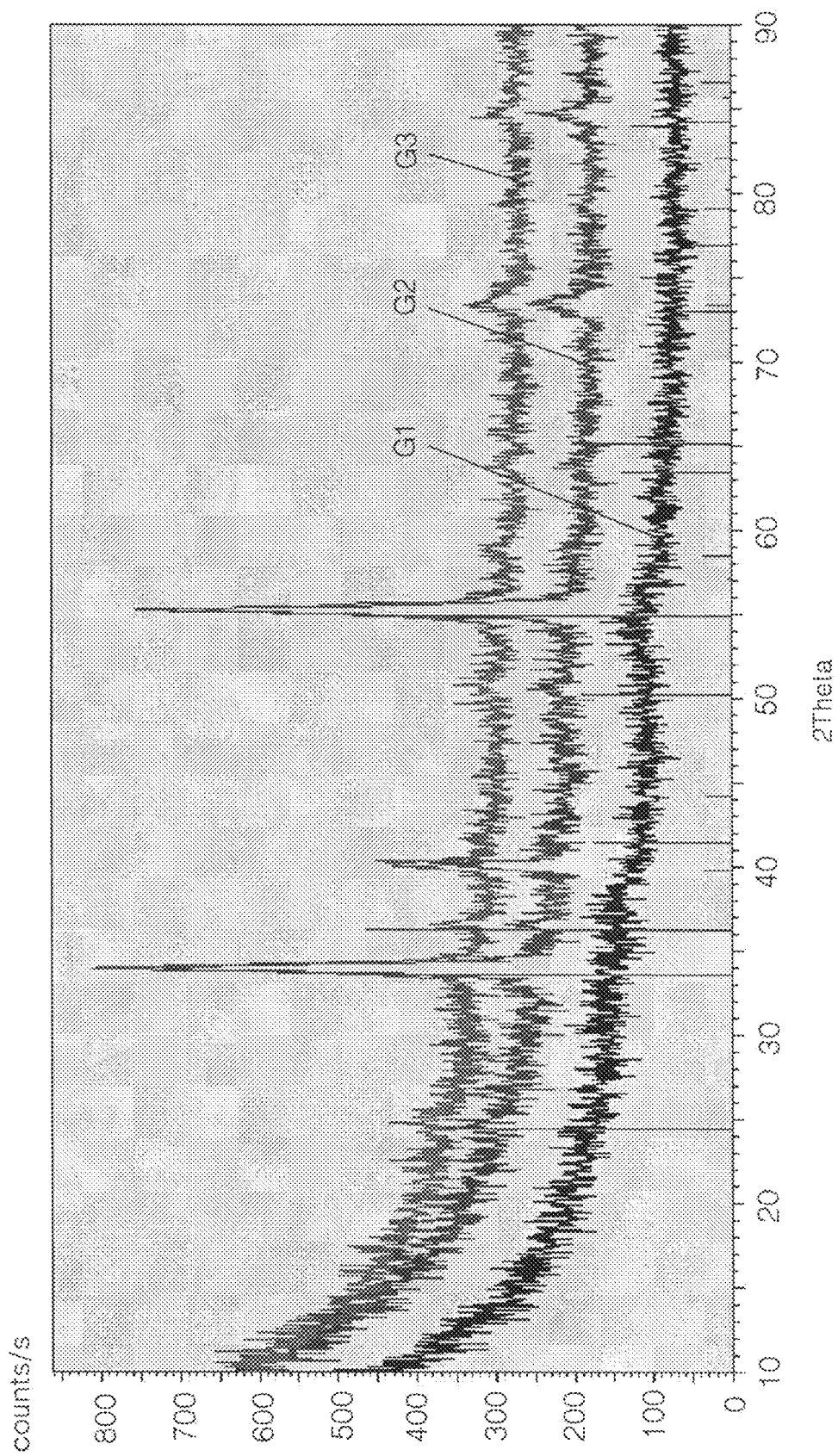

FIG. 8 shows graph results of an X-ray diffraction analysis experiment conducted so as to confirm whether the crystalline chromium oxide layer 14 formed by performing the first thermal treatment has an alpha-phase crystalline structure.

In FIG. 8, a first graph G1 represents the result regarding the amorphous chromium oxide layer 14a, and a second graph G2 represents the X-ray diffraction analysis result regarding the resultant product obtained by forming and thermally treating the amorphous chromium oxide layer 14a at a temperature of about 600° C. Also, a third graph G3 represents the X-ray diffraction analysis result regarding the resultant product obtained by forming and thermally treating the amorphous chromium oxide layer 14a at a temperature of about 700° C.

Comparing the first graph G1 to the second and third graphs G2 and G3, various peaks, which are not shown in the first graph G1, are shown in the second and third graphs G2 and G3. Because such peaks may be found in a chromium oxide layer having the alpha-phase crystalline structure, a crystalline structure of the crystalline chromium oxide layer 14 may be in an alpha-phase, wherein the crystalline chromium oxide layer 14 may be obtained by thermally treating the amorphous chromium oxide layer 14a at a temperature below about 700° C.

Figure 3:
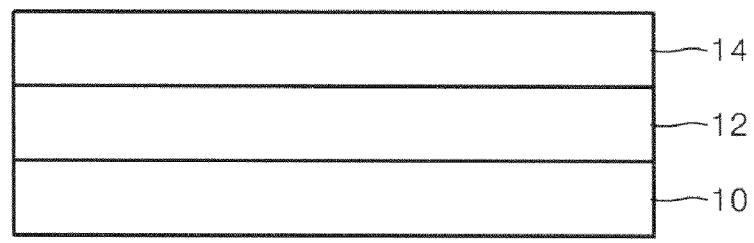

After the chromium oxide layer 14 having the alpha-phase crystalline structure may be obtained by thermally treating the amorphous chromium oxide layer 14a, a thermal treatment (hereinafter, referred to as 'a second thermal treatment) may be performed so as to crystallize the amorphous aluminum oxide layer 12a into an alpha-phase crystalline structure. An alpha-phase nucleation in a nano size may be caused because the chromium oxide layer 14 having the alpha-phase crystalline structure exists. Thus, the second thermal treatment may be performed at a temperature of about 1000° C. As a result of the second thermal treatment, as illustrated in FIG. 3, an alpha aluminium oxide layer 12 may be formed. After that, the chromium oxide layer 14 having the alpha-phase crystalline structure may be removed. If the thickness of the chromium oxide layer 14 is sufficiently small, removing the chromium oxide layer 14 may not be necessary.

Figure 9:
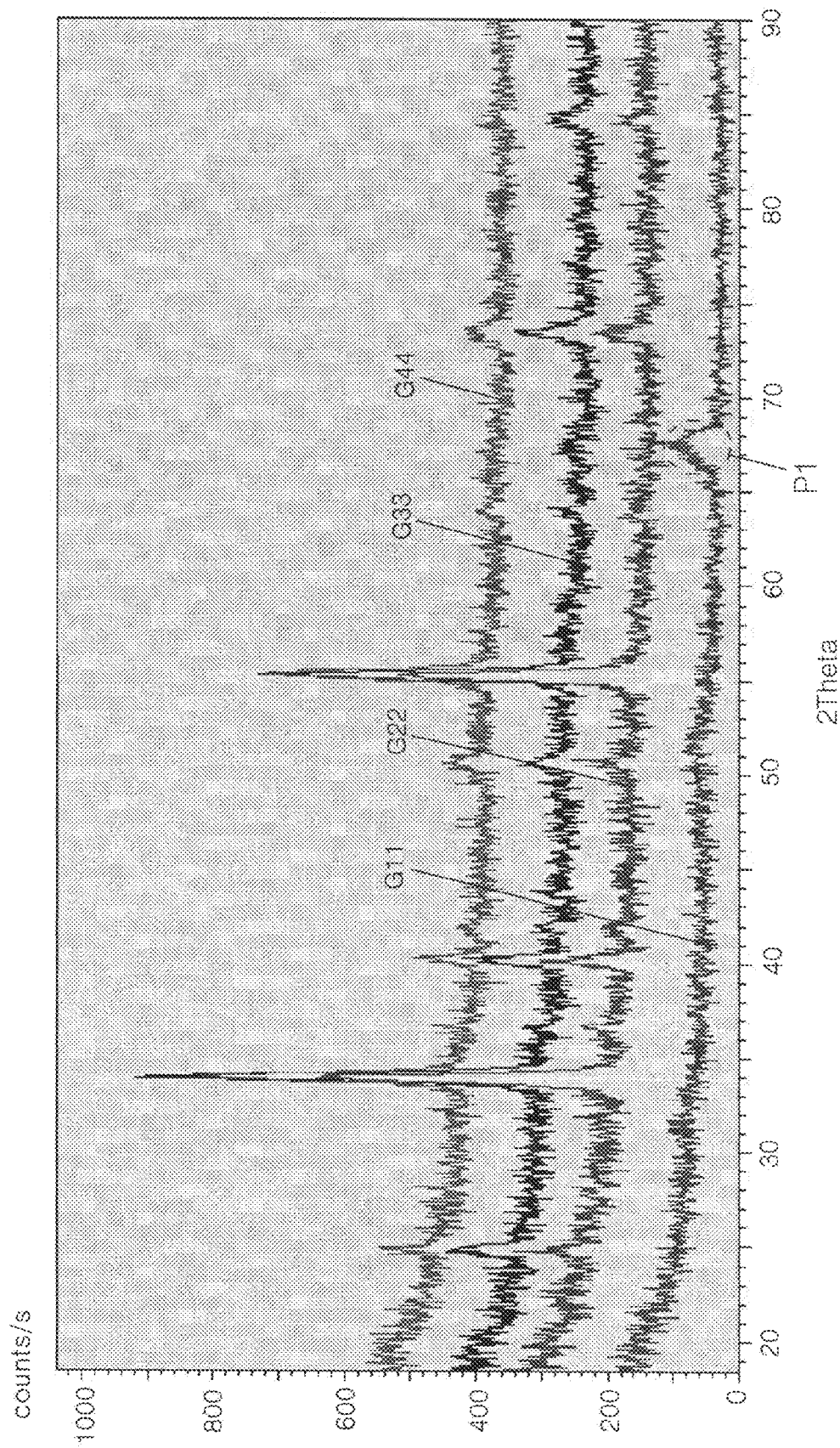

An experiment was conducted for confirming whether the crystalline aluminium oxide layer 12 formed by performing the second thermal treatment has an alpha-phase crystalline structure. FIG. 9 shows the results of the experiment.

In FIG. 9, a first graph G11 represents the X-ray diffraction analysis result regarding an output obtained by thermal treating a test specimen at a temperature of about 1100° C., wherein the test specimen does not include the amorphous chromium oxide ($Cr_2O_3$) layer 14a but only includes the amorphous aluminum oxide ($Al_2O_3$) layer 12a. A peak P1 of the first graph G11 represents that a crystalline aluminum oxide ($Al_2O_3$) layer, which may be thermal treated at a temperature of about 1100° C. without including the amorphous chromium oxide ($Cr_2O_3$) layer 14a and formed thereof, has a gamma-phase crystalline structure.

In FIG. 9, a second graph G22 represents the X-ray diffraction analysis result obtained by measuring the resultant product after forming the amorphous chromium oxide layer 14a on the amorphous aluminum oxide layer 12a and then thermally treating the resultant product at a temperature of about 700° C. A third graph G33 represents the result obtained by measuring the resultant product obtained by forming the amorphous chromium oxide layer 14a on the amorphous aluminum oxide layer 12a and then thermally treating each of the amorphous chromium oxide layer 14a and the amorphous aluminum oxide layer 12a at a temperature of about 700° C. and about 1050° C. so as to crystallize the amorphous chromium oxide layer 14a and the amorphous aluminum oxide layer 12a. Also, a fourth graph G44 represents the result obtained by measuring the resultant product obtained by forming the amorphous chromium oxide layer 14a on the amorphous aluminum oxide layer 12a and then thermally treating the resultant product at a temperature of about 1050° C.

Comparing the first graph G11 to the second through fourth graphs G22, G33, and G44, the peak P1 shown in the first graph G11 is not shown in the second through fourth graphs G22, G33, and G44. Thus, with test samples corresponding to the second through fourth graphs G22, G33, and G44, formation of the aluminum oxide layer having the gamma-phase crystalline structure may be restrained.

Such results suggest that the alpha-phase nucleation may be caused by the alpha-phase chromium oxide layer 14 when the chromium oxide layer 14 having the alpha-phase crystalline structure exists on the amorphous aluminum oxide layer 12a and thus, a crystalline structure of the crystalline aluminium oxide layer 12 crystallized by the thermal treatment may be in an alpha-phase.

Figure 10:
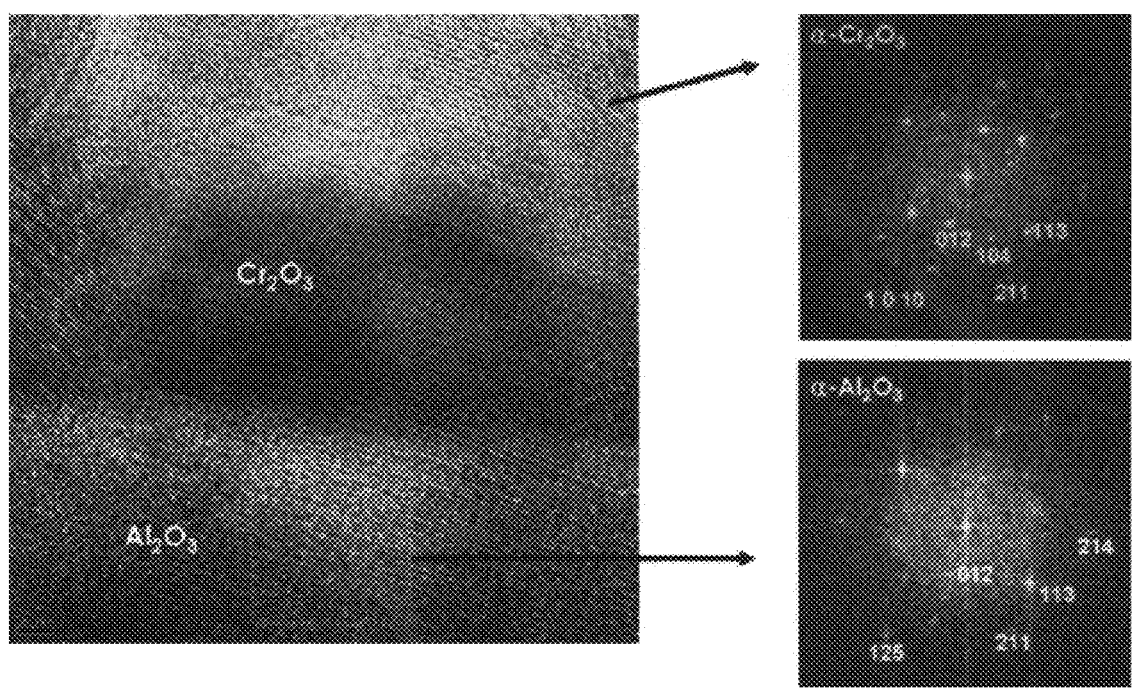

FIG. 10 illustrates Transmission Electron Microscope (TEM) pictures of a crystallized sample obtained by depositing an amorphous chromium oxide layer on an amorphous aluminum oxide layer and then performing a thermal treatment at a temperature of about 900° C.

Figure 11:
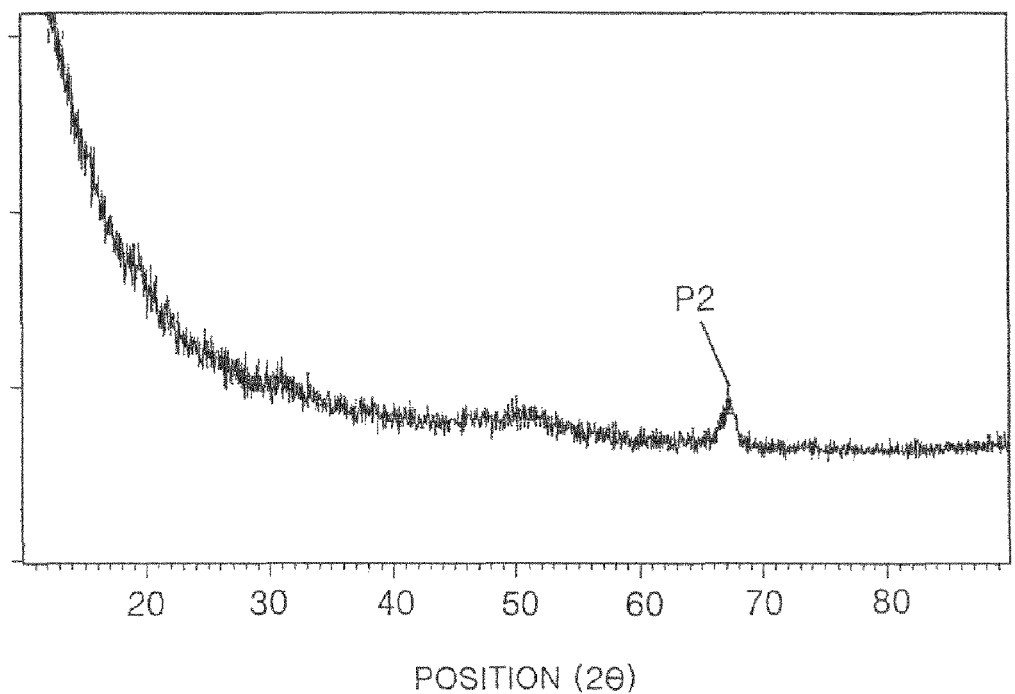

Referring to FIG. 10, a chromium oxide layer and an aluminum oxide layer, which have an alpha-phase crystalline structure, may be formed. FIG. 11 illustrates the results of an experiment conducted so as to determine whether a chromium oxide layer having an alpha-phase crystalline structure has an effect on an aluminum oxide layer having a gamma-phase crystalline structure. In the experiment, the resultant product may be obtained by depositing an amorphous chromium oxide layer on a crystalline aluminum oxide layer which has been thermally treated at a temperature of about 1100° C., and then by thermally treating the resultant product at a temperature of about 900° C. for crystallization.

Referring to FIG. 11, considering the position of a peak P2, a crystalline structure of the aluminum oxide layer, which has already been crystallized into the gamma-phase due to the thermal treatment at a temperature of about 1100° C., remains in the gamma-phase without being transformed to an alpha-phase, even though the alpha-phase chromium oxide layer may be used.

Where the method of forming the alpha aluminum oxide layer described in relation to FIGS. 1-3 is used in a method of manufacturing a semiconductor device, for example, in a method of manufacturing a charge trap memory device, the method of forming the alpha aluminum oxide layer may be used in a process of forming a blocking insulation layer.

Also, instead of using the chromium oxide layer 14 having the alpha-phase crystalline structure, other material layers which cause the alpha-phase nucleation may be used. Such examples are an alpha-$FeO_3$ layer, a $Ga_2O_3$ layer, an $Rh_2O_3$ layer, a $Ti_2O_3$ layer, a $V_2O_3$ layer, a gamma-$Al_2S_3$ layer and/or a $Co_2As_3$ layer. The chromium oxide layer 14 having the alpha-phase crystalline structure and the other material layers may decrease the crystallization temperature when the alpha aluminum oxide layer 12 is formed. Thus, the chromium oxide layer 14 having the alpha-phase crystalline structure and the other material layers may be a crystallization temperature decrease layer, or a crystalline auxiliary layer which decreases the crystallization temperature. Accordingly, the amorphous chromium oxide layer 14a may be an amorphous temperature decrease layer or an amorphous auxiliary layer.

Also, a densification process may be performed on the amorphous aluminum oxide layer 12a before or after the amorphous chromium oxide layer 14a is formed. For example, the densification process may be performed before the amorphous chromium oxide layer 14a is formed. The densification process may be performed at a temperature that does not affect crystallization of the amorphous aluminum oxide layer 12a. For example, the densification process may be performed at a temperature below about 800° C.

An experiment was conducted to determine how the densification process affects the formation of the alpha aluminum oxide layer 12. Except for the fact that the densification process was performed on the amorphous aluminum oxide layer 12a before the amorphous chromium oxide layer 14a was formed, the experiment was conducted identically to the experiment for obtaining the result shown in FIG. 9. A thermal treatment for densification of the amorphous aluminum oxide layer 12a was performed at a temperature of about 800° C.

Figure 12:
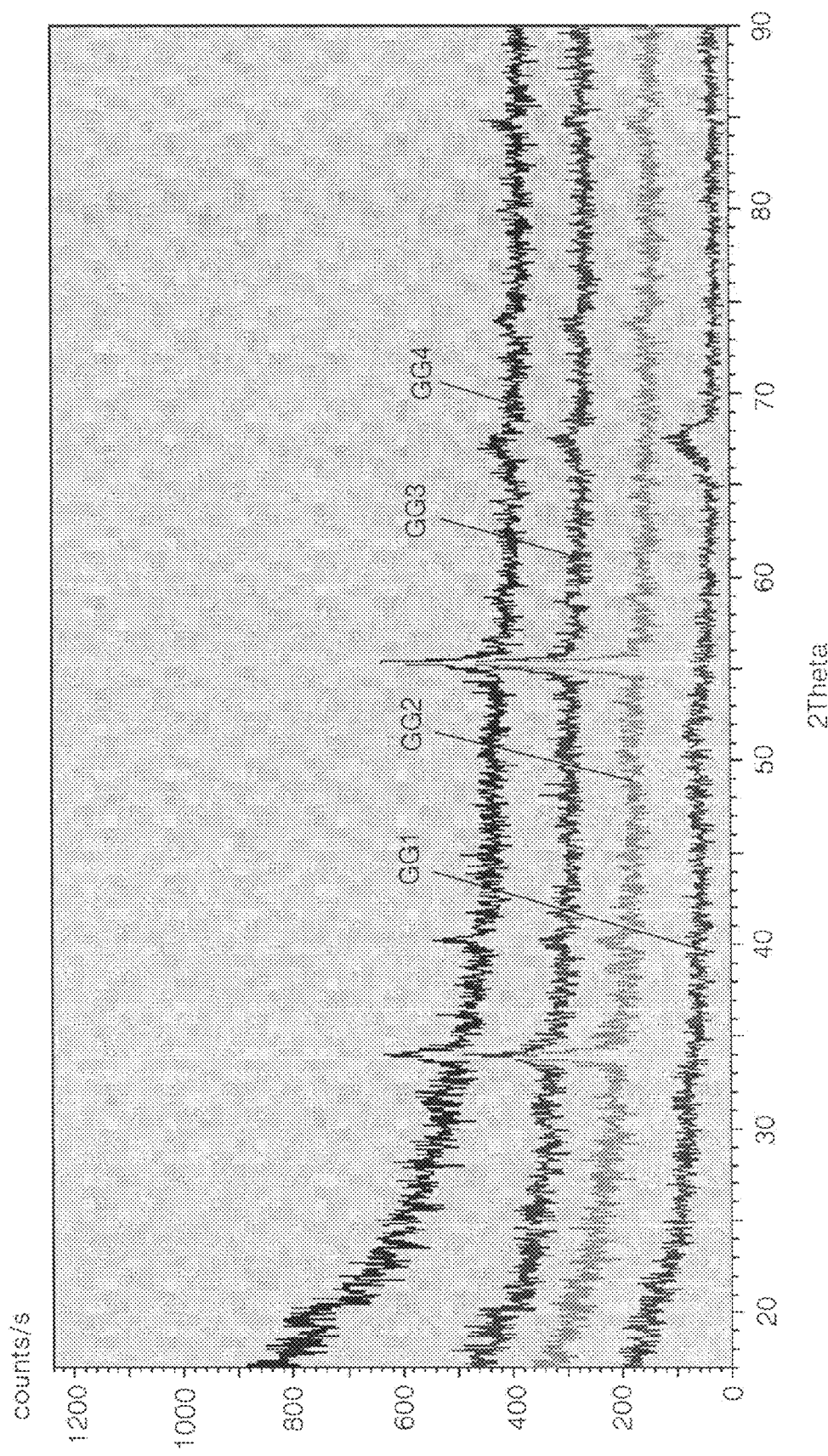

FIG. 12 shows the result of the experiment to determine the effect of the densification process. In FIG. 12, a first graph GG1 represents the X-ray diffraction analysis result regarding the resultant product obtained by thermally treating a test specimen at a temperature of about 1100° C., wherein the test specimen does not include the amorphous chromium oxide ($Cr_2O_3$) layer 14a but only includes the amorphous aluminum oxide ($Al_2O_3$) layer 12a. A peak P11 of the first graph GG1 represents that a crystalline aluminum oxide ($Al_2O_3$) layer, which may be thermally treated at a temperature of about 1100° C. without including the amorphous chromium oxide ($Cr_2O_3$) layer 14a and formed thereof, has a gamma-phase crystalline structure.

In FIG. 12, a second graph GG2 represents the X-ray diffraction analysis result obtained by measuring the resultant product from forming the amorphous chromium oxide layer 14a on the amorphous aluminum oxide layer 12a and then thermally treating the output at a temperature of about 700° C. A third graph GG3 represents the result obtained by measuring the resultant product from forming the amorphous chromium oxide layer 14a on the amorphous aluminum oxide layer 12a and then thermally treating the amorphous chromium oxide layer 14a and the amorphous aluminum oxide layer 12a at a temperature of about 700° C. and about 1050° C. so as to crystallize the amorphous chromium oxide layer 14a and the amorphous aluminum oxide layer 12a. Also, a fourth graph GG4 represents the result obtained by measuring the resultant product from forming the amorphous chromium oxide layer 14a on the amorphous aluminum oxide layer 12a and then thermally treating the amorphous chromium oxide layer 14a and the amorphous aluminum oxide layer 12a at a temperature of about 1050° C.

Comparing the first graph GG1 to the second through fourth graphs GG2, GG3, and GG4, and comparing the second through fourth graphs G22, G33, and G44 in FIG. 9 to the second through fourth graphs GG2, GG3, and GG4 in FIG. 12, the gamma-phase crystalline structure and the alpha-phase crystalline structure may be mixed in the crystalline aluminium oxide layer 12 in the second through fourth graphs GG2, GG3, and GG4 of FIG. 12.

Figure 4:
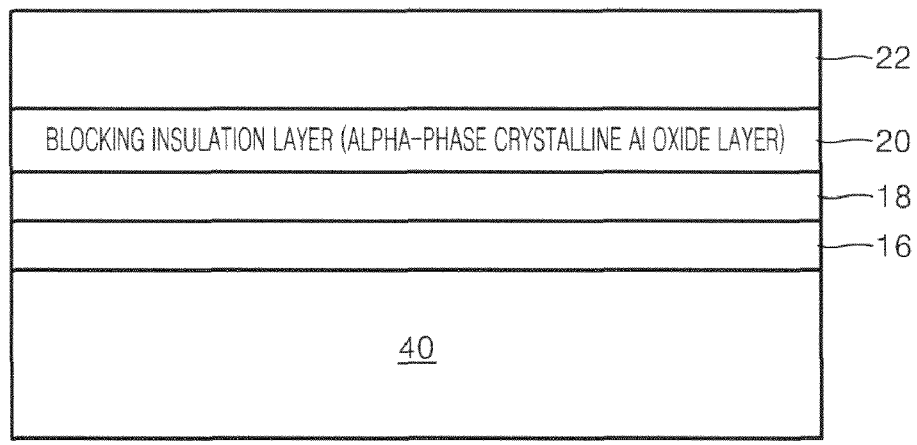

A method of manufacturing a charge trap memory device according to example embodiments will be described with reference to FIGS. 4-7. Referring to FIG. 4, a tunnelling film 16 may be formed on a substrate 40. The substrate 40 may be a silicon substrate. The tunnelling film 16 may be formed by a thermal oxidation method. A charge storage layer 18 may be formed on the tunnelling film 16. The charge storage layer 18 may be formed by a low-pressure chemical vapour deposition (LPCVD) method or other laminating methods. The charge storage layer 18 may include one of a silicon nitride layer, e.g., a $Si_3N_4$ layer, a metal nano dot, and a silicon nano dot. Also, the charge storage layer 18 may be formed to have a multi-layer structure or a mixed structure including at least two of the silicon nitride layer, the metal nano dot, and the silicon nano dot. The charge storage layer 18 may be one of a doped polysilicon film, a silicon nitride film, an $HfO_2$ film, a $La_2O_3$ film, and a $ZrO_2$ film, or may be a mixture including at least two of the doped polysilicon film, the silicon nitride film, the $HfO_2$ film, the $La_2O_3$ film, and the $ZrO_2$ film.

After the charge storage layer 18 is formed, a blocking insulation layer 20 may be formed thereon. The blocking insulation layer 20 may be an alpha aluminium oxide layer. The blocking insulation layer 20 may be formed by using the method described in relation to FIGS. 1-3. A gate electrode 22 may be formed on the blocking insulation layer 20. For example, an alpha-phase crystalline chromium oxide layer 14 formed on the blocking insulation layer 20 may be removed before the gate electrode 22 is formed. However, if the thickness of the alpha-phase crystalline chromium oxide layer 14 is sufficiently small, the alpha-phase crystalline chromium oxide layer 14 may not be removed. A work function of the gate electrode 22 may be over about 4.0 eV. For example, the gate electrode 22 may be a TaN electrode (tantalum nitride).

Figure 5:
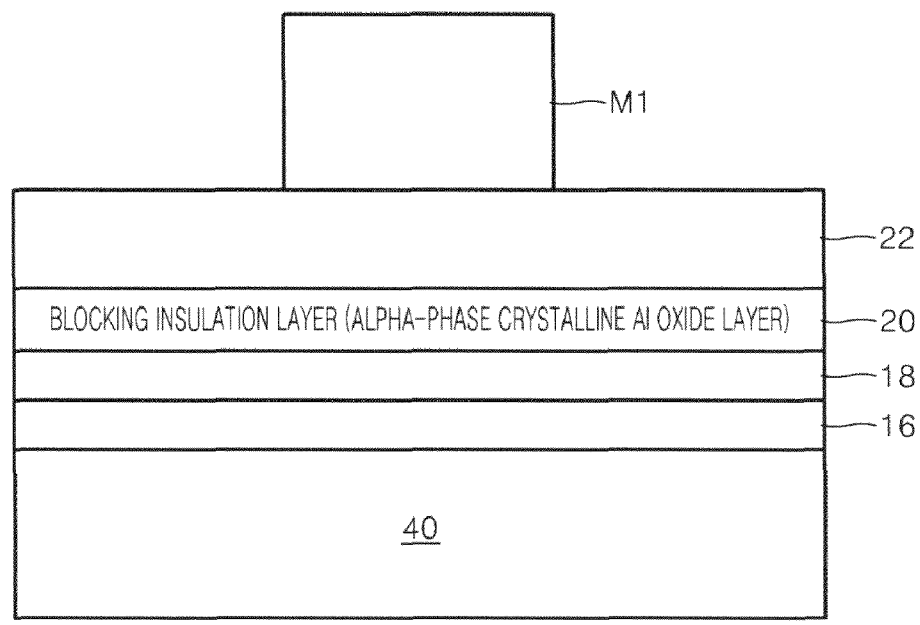

Referring to FIG. 5, after a mask M1 is formed on the gate electrode 22, the gate electrode 22 and the layers 20, 18, and 16 beneath the gate electrode 22 may be sequentially etched by the circumference of the mask M1.

Figure 6:
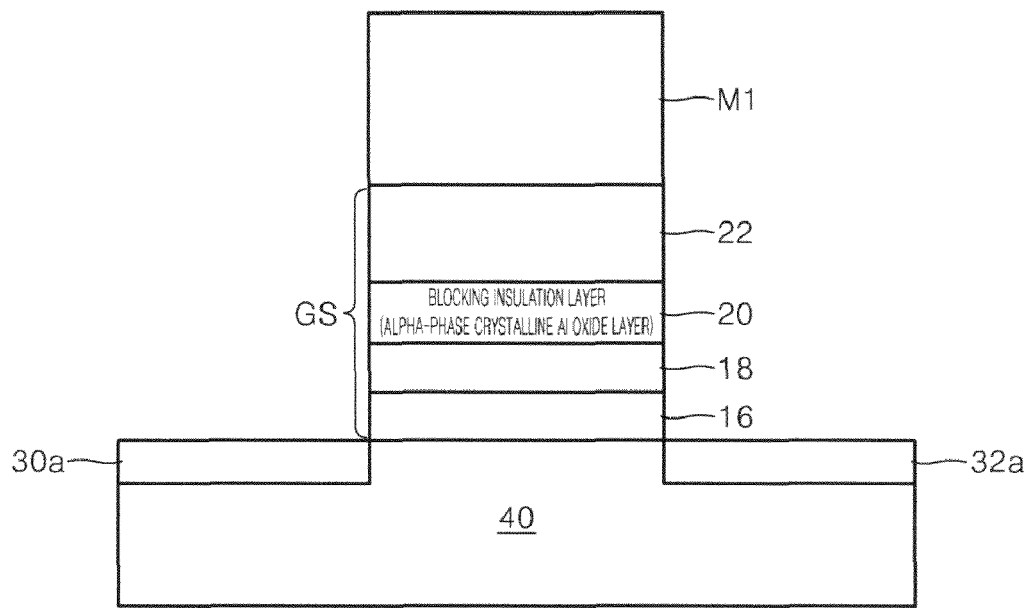

FIG. 6 illustrates a result of the etching. Referring to FIG. 6, a gate laminate GS may be formed by the etching, wherein the gate laminate GS includes the tunnelling film 16, the charge storage layer 18, the blocking insulation layer 20, and the gate electrode 22. Conductive impurities may be injected in the substrate 40 which may be exposed by the etching, so that first and second shallow impurity regions 30a and 32a may be formed on the substrate 40. Then, the mask M1 may be removed. Alternatively, the mask M1 may be removed before the first and second shallow impurity regions 30a and 32a are formed.

Figure 7:
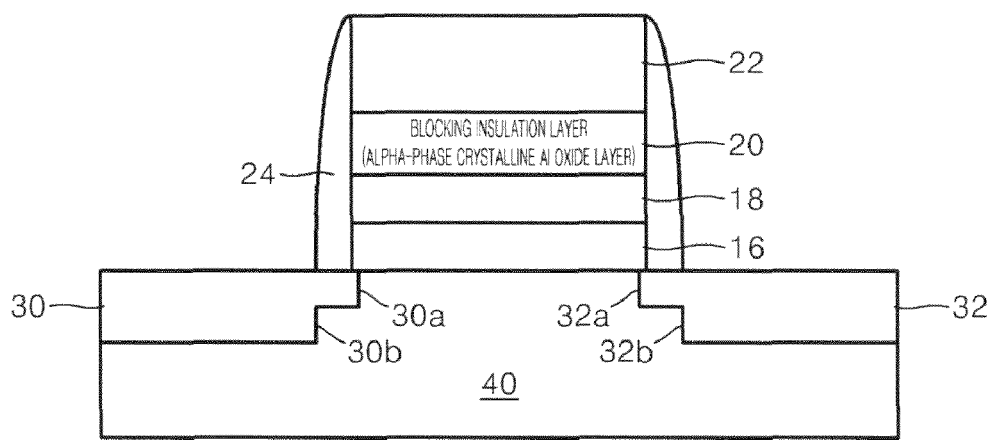

Referring to FIG. 7, a gate spacer 24 may be formed on a side surface of the gate laminate GS. The gate spacer 24 may be formed by forming a raw material film on the substrate 40, where the raw material film covers the gate laminate GS, and by performing an anisotropic etching on the raw material film until the substrate 40 may be exposed. After the gate spacer 24 is formed, conductive impurities may be injected in the substrate 40 so that each of first and second deep impurity regions 30b and 32b may be formed on the first and second shallow impurity regions 30a and 32a. As a result, first and second impurity regions 30 and 32, which have a lightly doped drain (LDD) structure, may be formed on the substrate 40. One of the first and second impurity regions 30 and 32 may be a source region, and the other may be a drain region.

Considering that the gate laminate GS may be covered with an interlayer insulating layer in a following process, formation of the gate spacer 24 is optional. Where the formation of the gate spacer 24 may be omitted, the first and second impurity regions 30 and 32 may be the same as the first and second shallow impurity regions 30a and 32a.

In the method of forming a memory device according to example embodiments, an aluminum oxide layer having an alpha-phase crystalline structure may be formed by using an auxiliary layer (for example, an alpha-phase chromium oxide layer). By using the auxiliary layer, the temperature at which the aluminum oxide layer having the alpha-phase crystalline structure is formed may be decreased to about 1000° C. or lower. Thus, example embodiments may prevent or reduce a side effect occurring when forming the aluminum oxide layer having an alpha-phase crystalline structure. Example embodiments may also prevent or reduce bending of the substrate under thermal stress. Also, example embodiments may enhance the charge retention capability of a charge trap memory device by forming an aluminum oxide layer having an alpha-phase crystalline structure on the charge trap memory device.

While example embodiments have been particularly shown and described with reference to example embodiments thereof, it will be understood by those of ordinary skill in the art that various changes in form and details may be made therein without departing from the spirit and scope of the appended claims. For example, it will be understood by those of ordinary skill in the art that the alpha-phase crystalline chromium oxide layer may be directly deposited on the amorphous aluminum oxide layer, instead of crystallizing the amorphous chromium oxide layer and then forming the alpha-phase crystalline chromium oxide layer on the amorphous aluminum oxide layer. Also, if the alpha-phase nucleation occurs instead of the formation of the alpha-phase crystalline chromium oxide layer, a metal layer may be formed. Accordingly, these and other changes and modifications are within the true spirit and scope of the appended claims. In the specification, example embodiments have been disclosed. Although specific terms are employed, they are used in a generic and descriptive sense only and not for purposes of limitation, the scope being set forth in the following claims.

What is claimed is:

1. A method of forming an alpha aluminum oxide layer comprising:
    forming an amorphous aluminum oxide layer on an underlying layer;
    forming a crystalline auxiliary layer on the amorphous aluminum oxide layer; and
    crystallizing the amorphous aluminum oxide layer such that the amorphous aluminum oxide layer becomes an aluminum oxide layer including an alpha-phase crystalline structure by using the crystalline auxiliary layer.

2. The method of claim 1, further comprising:
    removing the crystalline auxiliary layer.

3. The method of claim 1, wherein the underlying layer is made of a charge storage material.

4. The method of claim 3, wherein the charge storage material is silicon nitride.

5. The method of claim 1, wherein forming the crystalline auxiliary layer comprises:
    forming an amorphous auxiliary layer on the amorphous aluminum oxide layer; and
    crystallizing the amorphous auxiliary layer.

6. The method of claim 1, wherein before forming the crystalline auxiliary layer, a densification process is performed on the amorphous aluminum oxide layer.

7. The method of claim 5, wherein the densification process for the amorphous aluminum oxide layer is performed before the amorphous auxiliary layer is formed.

8. The method of claim 5, wherein the crystallization of the amorphous auxiliary layer and the crystallization of the amorphous aluminum oxide layer are simultaneously performed at a temperature below about 1000° C.

9. The method of claim 1, wherein the crystalline auxiliary layer is one of a $Cr_2O_3$ layer having an alpha-phase crystalline structure, an alpha-$FeO_3$ layer, a $Ga_2O_3$ layer, an $Rh_2O_3$ layer, a $Ti_2O_3$ layer, a $V_2O_3$ layer, a gamma-$Al_2S_3$ layer, and a $Co_2As_3$ layer.

10. The method of claim 5, wherein the crystallization of the amorphous auxiliary layer is performed at a temperature lower than a temperature for the crystallization of the amorphous aluminum oxide layer.

11. The method of claim 10, wherein the crystallization of the amorphous auxiliary layer is performed at a temperature below about 800° C.

12. The method of claim 2, wherein in removing the crystalline auxiliary layer, the crystalline auxiliary layer is partially removed.

13. The method of claim 5, wherein the crystalline auxiliary layer is one of a $Cr_2O_3$ layer having the alpha-phase crystalline structure, an alpha-$FeO_3$ layer, a $Ga_2O_3$ layer, an $Rh_2O_3$ layer, a $Ti_2O_3$ layer, a $V_2O_3$ layer, a gamma-$Al_2S_3$ layer, and a $Co_2As_3$ layer.

14. A method of manufacturing a charge trap memory device comprising:
    forming a tunneling film, a charge storage layer, a blocking insulation layer, and a gate electrode on a substrate,
    wherein forming the blocking insulation layer includes:

forming the alpha aluminum oxide layer according to claim 1, in which the charge storage layer is the underlying layer.

15. The method of claim 14, wherein forming the charge storage layer includes forming one of a silicon nitride film, a metal nano dot, and a silicon nano dot.

16. The method of claim 14, wherein forming the charge storage layer includes forming a multi-layer structure or a mixed structure with at least two of a silicon nitride film, a metal nano dot, and a silicon nano dot.

17. The method of claim 14, wherein forming the charge storage layer includes forming a doped polysilicon film, a silicon nitride film, an $HfO_2$ film, a $La_2O_3$ film, and a $ZrO_2$ film or the charge storage layer is one of a mixture including at least two of the doped polysilicon film, the silicon nitride film, the $HfO_2$ film, the $La_2O_3$ film, and the $ZrO_2$ film.

18. The method of claim 14, wherein a work function of the gate electrode is over about 4.0 eV.

19. The method of claim 18, wherein forming the gate electrode includes forming a TaN (tantalum nitride) electrode.

* * * * *